United States Patent
Lewiner et al.

[11] Patent Number: 5,929,625
[45] Date of Patent: Jul. 27, 1999

[54] METHOD AND APPARATUS FOR MONITORING ANTI-LIGHTNING PROTECTION EQUIPMENT

[76] Inventors: Jacques Lewiner, 7 avenue de Suresnes, 92210 Saint-Cloud; Eugeniusz Smycz, 4 rue du Val Fleury, 91240 Saint-Michel-Sur-Orge, both of France

[21] Appl. No.: 08/727,670

[22] PCT Filed: Apr. 14, 1995

[86] PCT No.: PCT/FR95/00499

§ 371 Date: Dec. 17, 1996

§ 102(e) Date: Dec. 17, 1996

[87] PCT Pub. No.: WO95/28646

PCT Pub. Date: Oct. 26, 1995

[30] Foreign Application Priority Data

Apr. 18, 1994 [FR] France .................................. 94 04597

[51] Int. Cl.⁶ .................................................. G01R 27/26
[52] U.S. Cl. ................... 324/72; 324/72; 324/509
[58] Field of Search ........................... 324/452, 72, 509, 324/127, 102; 340/457, 664

[56] References Cited

U.S. PATENT DOCUMENTS

| | | | |
|---|---|---|---|
| 3,469,188 | 9/1969 | Hall | 324/102 |
| 3,889,185 | 6/1975 | Wojtasinski | 324/72 |
| 4,105,966 | 8/1978 | Lennon | 324/102 |
| 4,112,357 | 9/1978 | Livermore | 324/72 |
| 4,528,497 | 7/1985 | Arato | 324/509 |
| 4,558,275 | 12/1985 | Borowy | 324/103 P |
| 4,577,148 | 3/1986 | Sweetana | 324/72 |
| 4,706,016 | 11/1987 | Schweitzer | 324/102 |
| 5,168,212 | 12/1992 | Byerley, III et al. | 324/72 |
| 5,497,075 | 3/1996 | Boudet | 324/72 |
| 5,555,207 | 9/1996 | Barker | 324/72 |
| 5,654,641 | 8/1997 | Query | 324/529 |

*Primary Examiner*—Maura Regan
*Attorney, Agent, or Firm*—Larson & Taylor

[57] ABSTRACT

The invention relates to a method of monitoring anti-lightning protection equipment that includes a grounding line (1), the method being characterized in that a "lightning" electrical current travelling along the grounding line is measured. The measurement may be obtained, in particular, by means of a magnetic circuit (2) constituting a closed loop around the grounding line, and electrical circuit that includes a winding (5) disposed around the magnetic circuit so that a lightning current travelling along the grounding line induces current in said winding, the magnetic circuit including a core (3) of solid magnetic material that has at least one gap in the magnetic circuit, said gap being occupied by material that is not magnetic.

12 Claims, 1 Drawing Sheet

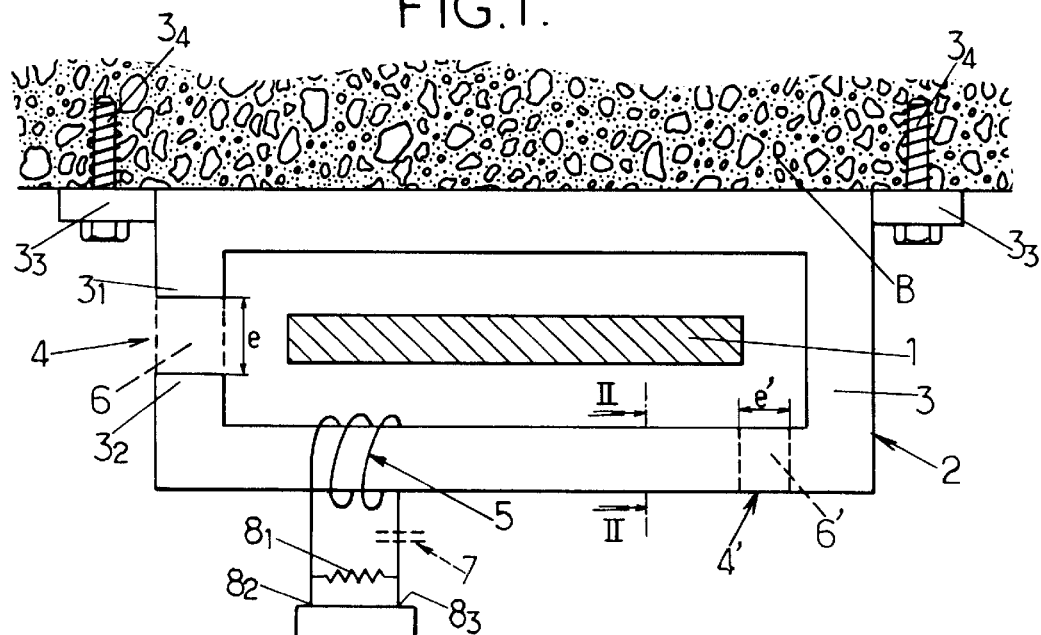
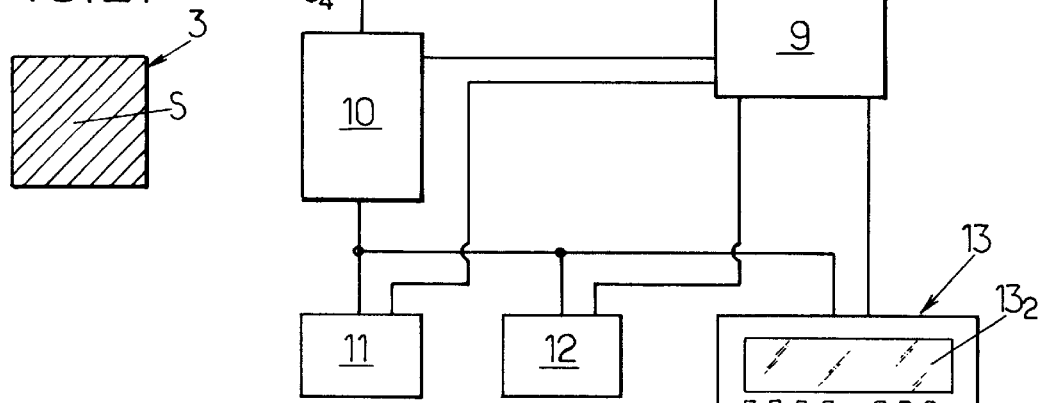
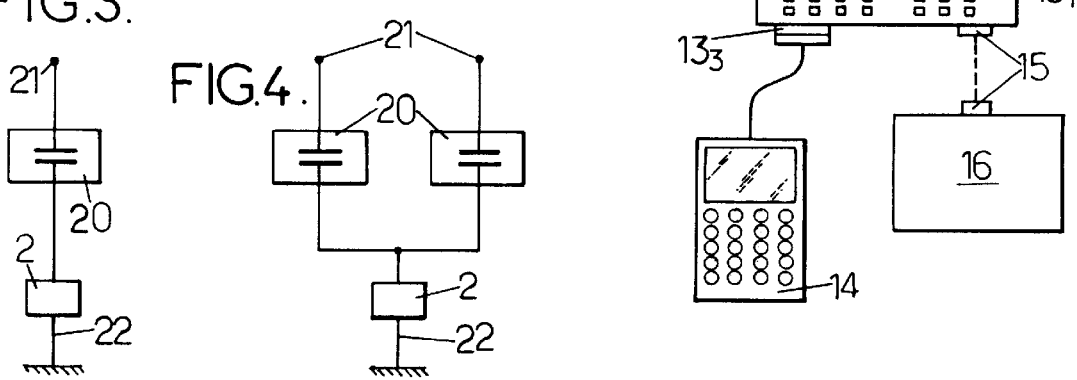

METHOD AND APPARATUS FOR MONITORING ANTI-LIGHTNING PROTECTION EQUIPMENT

The present invention relates to methods and apparatuses for monitoring anti-lightning protection equipment, in particular lightning rods and dischargers or lightning arresters.

Lightning rods comprise a metal rod or spike secured vertically on the roof top of a structure to be protected and connected to the ground via a grounding line. Because it is at ground potential, the metal spike captures lightning, and the grounding line conveys lightning to the ground where it is dissipated.

Since the amount of lightning energy captured by a lightning rod can be considerable, this energy may possibly damage the grounding line, or more commonly it may dry out the ground at the interface between the ground and the grounding line. When this happens, the resistance between the ground and the spike of the lightning rod becomes greater than normal.

Consequently, the grounding line that runs up the height of the structure to be protected can then be raised to electrical potentials that are very high when lightning strikes the lightning rod. These potentials can in turn propagate through the structure of the building and may cause fire to break out, or may at least severely disturb the operation of electrical equipment or electronic equipment contained in the structure to be protected.

To avoid such accidents, the quality of the electrical connection between ground and the lightning rod is therefore checked from time to time.

Such checking may be performed either at regular intervals, however that runs the rise of checking being pointless if lightning has not struck the lightning rod since the previous check, or of being too late if lightning happened to damage the lightning rod shortly after said previous check.

That is why lightning rods are sometimes monitored by counting the number of times they have been struck by lightning since the preceding check. When the number reaches a predetermined value, then the quality of the electrical connection between ground and the lightning rod is checked.

Usually, such counting is performed by means of a device that comprises a magnetic circuit that forms a closed loop around the grounding line of the lightning rod, and an electrical circuit including at least one turn wound around the magnetic circuit so that lightning current passing along the grounding line induces current in said turn, the turn being connected to a relay which causes a mechanical counter to advance by one step on each occasion that it closes.

Nevertheless, that method of monitoring a lightning rod suffers from the drawback of not taking into account the magnitude of each lightning strike received by the lightning rod.

A predetermined number of low energy lightning strikes will not produce any damage to the grounding line, and will cause relatively little drying out of the ground at the interface between the ground and the grounding line, whereas a single lightning strike of exceptional energy runs the risk on its own either of destroying or damaging the grounding line or else of severely drying out the ground at the interface between the ground and the grounding line.

The same drawbacks apply to methods of monitoring other anti-lightning protection equipment, in particular dischargers or lightning arrestors, if they operate merely by counting lightning strikes. With dischargers or lightning arrestors, a single high-energy lightning strike runs the risk of damaging not only the connection to ground, but also, and above all, the discharger or arrestor itself.

A particular object of the present invention is therefore to propose a method of monitoring equipment for providing protection against lightning, which method avoids the above-mentioned drawbacks and makes it possible to trigger checking of said equipment as soon as it is liable to have been damaged or to have suffered any deterioration in its electrical characteristics.

To this end, the invention provides a method of monitoring anti-lightning protection equipment that includes a grounding line, the method being essentially characterized in that a "lightning" electrical current is measured travelling along the grounding line on each occasion that it dissipates a lightning strike.

Preferably, at least one value of the lightning current is recorded together with the data of said lightning current on each occasion that the grounding line dissipates a lightning strike.

The invention also provides an apparatus for monitoring anti-lightning protection equipment that includes a grounding line, the apparatus being characterized in that it includes measurement means for measuring a "lightning" electrical current travelling along the grounding line on each occasion that it dissipates a lightning strike.

In perferred embodiments of the device of the invention, use is also made of one or more of the following dispositions:

recording means are provided for recording at least one lightning current value and a date of said lightning current on each occasion that the grounding line dissipates a lightning strike;

the record means are designed to record a maximum value of the lightning current on each occasion that the grounding line dissipates a lightning strike;

the recording means are designed to record a succession of values of the lightning current as a function of time, on each occasion that the grounding line dissipates a lightning strike;

the measurement means include:

a magnetic circuit which forms a closed loop and which is designed to be disposed around the grounding line so that the lightning current travelling along the grounding line generates a magnetic field in said magnetic circuit, said magnetic circuit including a core made of a solid magnetic material that extends along the magnetic circuit and that includes at least one complete gap, said gap being occupied by a non-magnetic material; and an electrical circuit including a winding disposed around the magnetic circuit so that the magnetic field generated in said magnetic circuit passes axially along said winding, thereby generating an induced current in said winding representative of the lightning current, the gap in the magnetic core serving firstly to enable the current induced in the winding to be a substantially linear function of the lightning current in spite of the very wide range of possible values for the lightning current, and secondly enabling said induced current to be substantially insensitive to the frequency spectrum of the lightning current;

the, or each, gap in the magnetic core has a width, and the magnetic core has a mean section such that the total width of the gap or gaps in the magnetic core lies in the range half to twice the square root of the section of the magnetic core;

the gap in the magnetic core is constituted by an air gap;

the gap in the magnetic core is constituted by a lenght of non-magnetic solid material which is fitted to the magnetic core;

said length of non-magnetic material is removable;

a capacitor is connected in series with the winding to block high frequency components of the current induced in said winding;

the measurement means deliver a signal representative of the lightning current, said measurement means being connected to a microprocessor to transmit said signal thereto, the microprocessor being connected to a clock, a memory, and an interface, and said microprocessor being programmed to store in the memory the lightning current measurements that are supplied thereto by the measurement means together with the corresponding date (e.g.: day, month, year, hours, minutes, seconds) of the lightning current, the microprocessor also being programmed to play back the contents of the memory to the interface circuit;

the interface circuit is connected to telephone interface via means for remote transmission of information without making electrical contact; and the microprocessor is programmed to play back the contents of the memory to the interface only after it has previously received a determined code signal.

The invention also provides anti-lightning protection equipment provided with monitoring apparatus as defined above.

Other characteristics and advantages of the invention appear from the following detailed description of an embodiment thereof, given by way of non-limiting example and with reference to the accompanying drawing.

In the drawing:

FIG. 1 is a diagrammatic view of monitoring apparatus of the invention fitted to the grounding line of a lightning rod;

FIG. 2 is a section view on line II—II of FIG. 1; and

FIGS. 3 and 4 are highly diagrammatic representations of dischargers or lightning arrestors fitted with monitoring apparatus similar to that of FIGS. 1 and 2.

FIG. 1 shows an outside wall B of a building that has a conductive grounding line 1 running vertically therealong, connected at one end to a lightning rod spike (not shown), and at its other end to ground. In general, the grounding line is in the form of a copper tape.

At least a portion of the grounding line 1 is spaced apart from the wall B by supports (not shown), sa as to enable a magnetic circuit 2 to be disposed in a loop around the grounding line 1, but without coming into electrical contact with said line.

In the example shown in FIG. 1, the magnetic circuit 2 comprises a core 3 of magnetic material, e.g. soft iron or preferably ferrite, which core extends around the grounding line 1 but does not provide a fully closed loop since the core 3 has two axial ends $3_1$ and $3_2$ which are spaced apart from each other by a gap 4 that is filled with air and that serves to complete the magnetic circuit. Thus, the magnetic circuit 2 comprises both the core 3 and also the gap 4 which is occupied by a non-magnetic material, in this case air.

In particular example shown, the core 3 is in the form of a substantially rectangular frame of section S that is also rectangular (see FIG. 2) and that may be two centimeters by two centimeters, for example.

One of the sides of the frame constituted by the core 3 is adjacent to the wall B and is fixed thereto by tabs $3_3$ having screws $3_4$ passing therethrough and penetrating into the wall B. Nevertheless, the core 3 could be of any other shape that extends around the grounding line 1, so long as it has at least one gap; and it could be fixed to the wall B by any other means.

In a variant, the gap 4 could be occupied by a length 6 of a solid material that is not magnetic, e.g. copper or aluminum.

Because of the gap 4, the magnetic field induced in the magnetic circuit 2 by lightning current travelling along the grounding line 1 is a substantially linear function of the lightning current, and secondly the overall permeability of the magnetic circuit is substantially independent of the frequency spectrum of the lightning current, unlike a magnetic core which is in the form of a fully closed loop.

Preferably, to achieve optimum efficiency of the magnetic circuit 2, the width e of the gap 4 lies in the range ½√S to 2√S.

In addition, when the gap 4 is left empty, it provides the advantage of making it easier to install the magnetic circuit 2 on a grounding line 1 that is already in place, since the grounding line can be passed through the gap into the frame that is formed by the magnetic circuit.

Similarly, if the gap 4 is occupied by a solid length 6 of non-magnetic material, it is advantageous for said length to be removable.

The magnetic core 3 may optionally be interrupted at a plurality of locations. As shown in FIG. 1, it may be interrupted, for example, not only by the above-mentioned gap 4, but also by an additional gap 4' that is occupied by a non-magnetic solid material 6' which is fixed to the core 3 on either side of the gap 4'.

In this case, it is preferable for the sum of the widths e+e' of the gaps 4 and 4' still to lie in the range ½√S to 2√S.

An electric circuit that includes a winding 5 having at least one turn and maybe as many several tens of turns is wound round the magnetic core 3, or possibly around one of the gaps 4 or 4', particularly if the gap is occupied by a solid non-magnetic material 6 or 6'. In this manner, a magnetic field induced in the core by the passage of lightning current along the grounding line 1 passes axially through the winding 5 and induces current in said winding that is representative of the lightning current, and that is a substantially linear function of said lightning current. This makes it possible to measure the lightning current to an accuracy of within about 10%.

The circuit including the winding 5 is connected to two input terminals $8_2$ and $8_3$ of an analog-to-digital converter 8, a resistor $8_1$ being connected in parallel between the two inputs $8_2$ and $8_3$ to deliver a voltage signal across said inputs that is proportional to the current conveyed by the winding 5. The resistor $8_1$ may optionally be included in the analog-to-digital converter 8.

Advantageously, a capacitor 7 is connected in series with the winding 5 so as to block the highest frequency components of the current induced in the winding 5.

The analog-to-digital converter 8 is powered by a power supply circuit 9 which be of any known type, and which may possibly use energy from the electromagnetic wave is generated during the formation of a lightning flash, as taught by document FR-A-2 624 319, for example.

The analog-to-digital converter 8 also includes an output terminal 8, which is connected to a microprocessor 10 in order to deliver thereto a signal that is representative of the lightning current.

The microprocessor 10 is also powered by the power supply circuit 9, and it is connected to a clock 11, to a memory 12, and to an interface circuit 13, with the three circuits 11, 12, 13 likewise being powered by the power supply 9.

The microprocessor 10 may be programmed to store in the memory 12, on each occasion that lightning strikes the lightning rod, the maximum value of the lightning current together with the date on which said current occurred (e.g.: day, month, year, hours, minutes, seconds), said date being provided by the clock 11.

The microprocessor 10 may optionally also be programmed to store in the memory 12, on each occasion that lightning strikes the lightning rod, a succession of lightning current values as a function of time, i.e. the curve of the lightning current as a function of time, together with the date of the lightning strike in question.

The interface circuit 13 may optionally include a keypad $13_1$ and screen $13_2$ for interrogating the memory 12 via the microprocessor 10 to make it possible to check the intensity of lightning currents that have travelled along the grounding line 1 on each occasion that lightning has struck the lightning rod in a given period.

The interface circuit 13 need not necessarily include a keypad and a screen, but may merely have a connector $13_3$ to which a portable unit 14 can be connected, which unit has a keypad and a screen, and serves to check the lightning currents stored in the memory 12. The interface circuit 13 may alternatively include not only a keypad and a screen, but also a connector $13_3$.

It would also be possible to connect a printer to the interface circuit 13 so as to print out the measured values of lightning currents together with their dates, or indeed to print out curves of lightning current, together with the corresponding dates.

As shown in FIG. 1, the interface circuit 13 may also be connected to a telephone transmitter 16 via optical couplers or possibly acoustic couplers 15 (to provide electrical isolation between the circuits 13 and 16), thereby enabling the contents of the memory 12 to be remotely interrogated by means of the microprocessor 10.

The microprocessor is preferably programmed to give the contents of the memory 12 to the interface 13 only if it has previously received a specified encoded signal so as to preserve the confidentiality of the data contained in the memory 12.

As shown in FIGS. 3 and 4, apparatus similar to that shown in FIGS. 1 and 2 can be used to monitor one or more dischargers or lightning arrestors 20 protecting electricity lines 21 of low, medium, or high tension, by measuring the lightning current carried by the grounding lines 22 of said dischargers or lightning arrestors by means of respective magnetic circuits 2 similar to that described above.

When a plurality of dischargers or lightning arrestors 20 are to be monitored, it is possible to provide a single grounding line 22 and monitoring apparatus for each of them (FIG. 3) or else to provide a ground line 22 that is common to a plurality of dischargers or lightning arrestors, together with single monitoring apparatus that is likewise common and that is fitted to the common grounding line (FIG. 4).

We claim:

1. Apparatus for monitoring anti-lightning protection equipment that includes a grounding line, which is designed to dissipate the lightning strikes and which is then traversed by an electrical current, called a lightning current, said lightning current having a certain intensity and a certain frequency spectrum, said apparatus including means for measuring the intensity of the lightning current to produce a lightning current measurement which is a substantially linear function of the lightning current, the measuring means measuring the intensity of the lightning current to produce a said lightning current measurement on each occasion that the grounding line dissipates a lightning strike and said apparatus further including recording means for recording at least one value of the lightning current measurement on each occasion that the grounding line dissipates a lightning strike, said measurement means further including a magnetic circuit which forms a closed loop and which is disposed around the grounding line so that the lightning current travelling along the grounding line generates a magnetic field in said magnetic circuit, said magnetic circuit including a magnetic core, made of a solid magnetic material, including at least one complete gap occupied by a non-magnetic material, and an electrical circuit including a winding disposed around the magnetic core so that the magnetic field generated in said magnetic core passes axially along said winding to thereby generate an induced current in said winding representative of the lightning current, the at least one gap in the magnetic core having a total width, and the magnetic core having a mean cross section such that the total width of the at least one gap in the magnetic core lies in the range of one half to twice the square root of the cross section of the magnetic core.

2. Apparatus according to claim 1, in which the recording means is designed to record a maximum value of the lightning strike on each occasion that the grounding line dissipates a lightning strike.

3. Apparatus according to claim 1, in which the recording means is designed to record a succession of values of the lightning strike as a function of time, on each occasion that the grounding line dissipates a lightning strike.

4. Apparatus according to claim 3, in which the gap in the magnetic core is constituted by an air gap.

5. Apparatus according to claim 3, in which the gap in the magnetic core is constituted by a length of non-magnetic solid material which is fitted to the magnetic core.

6. Apparatus according to claim 5, in which said length of non-magnetic material is removable.

7. Apparatus according to claim 3, in which a capacitor is connected in series with the winding to block high frequency components of the current induced in said winding.

8. Apparatus according to claim 1, in which the measurement means produces a signal representative of the lightning current, said measurement means being connected to a microprocessor to transmit said signal thereto, the microprocessor being connected to a clock, a memory, and an interface, and said microprocessor being programmed to store in the memory the lightning current measurements that are supplied thereto by the measurement means together with the corresponding date of the lightning current, the microprocessor also being programmed to play back the contents of the memory to the interface circuit.

9. Apparatus according to claim 8, in which the interface circuit is connected to a telephone interface via means for remote transmission of information without making electrical contact.

10. Apparatus according to claim 8, in which the microprocessor is programmed to play back the contents of the memory to the interface only after the microprocessor has previously received a determined code signal.

11. Equipment for providing anti-lightning protection and provided with monitoring apparatus according to claim 1.

12. Apparatus according to claim 1, which said recording means further records a date for a said lightning current measurement, in addition to said at least one value of said lightning current measurement, for each occasion on which the grounding line dissipates a lightning strike.

* * * * *